US009825626B2

(12) United States Patent
Rahman et al.

(10) Patent No.: US 9,825,626 B2
(45) Date of Patent: Nov. 21, 2017

(54) PROGRAMMABLE HIGH-SPEED EQUALIZER AND RELATED METHOD

(71) Applicant: QUALCOMM, Incorporated, San Diego, CA (US)

(72) Inventors: Mohammed Mizanur Rahman, San Diego, CA (US); Jacob Stephen Schneider, San Diego, CA (US); Thomas Clark Bryan, Carlsbad, CA (US); LuVerne Ray Peterson, San Diego, CA (US); Gregory Francis Lynch, San Diego, CA (US); Alvin Leng Sun Loke, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 30 days.

(21) Appl. No.: 14/792,441

(22) Filed: Jul. 6, 2015

(65) Prior Publication Data

US 2016/0294383 A1 Oct. 6, 2016

Related U.S. Application Data

(60) Provisional application No. 62/140,364, filed on Mar. 30, 2015.

(51) Int. Cl.
*H03K 17/00* (2006.01)
*H03K 17/687* (2006.01)
(Continued)

(52) U.S. Cl.
CPC ....... *H03K 17/687* (2013.01); *H03F 3/45197* (2013.01); *H04L 25/0272* (2013.01);
(Continued)

(58) Field of Classification Search
CPC .............................. H03K 17/00; H03K 17/687
See application file for complete search history.

(56) References Cited

U.S. PATENT DOCUMENTS

| 5,905,398 A | * | 5/1999 | Todsen | ................ | H03K 17/693 |
|---|---|---|---|---|---|
| | | | | | 327/337 |
| 6,937,054 B2 | * | 8/2005 | Hsu | .................... | H04L 25/0272 |
| | | | | | 326/115 |

(Continued)

FOREIGN PATENT DOCUMENTS

EP 1806850 A2 7/2007

OTHER PUBLICATIONS

International Search Report and Written Opinion—PCT/US2016/021617—ISA/EPO—dated Jun. 8, 2016.

*Primary Examiner* — Hai L Nguyen
(74) *Attorney, Agent, or Firm* — Loza & Loza, LLP/Qualcomm

(57) ABSTRACT

A programmable equalizer and related method are provided. The equalizer includes a pair of current-setting field effect transistors (FETs) coupled in series with a pair of input FETs and a pair of load resistors, respectively, between a first voltage rail (Vdd) and a second voltage rail (ground). A programmable equalization circuit is coupled between the sources of the input FETs, comprising a plurality of selectable resistive paths and a variable capacitor, which could also be configured as a plurality of selectable capacitive paths. Each of the selectable resistive paths (as well as each of the selectable capacitive paths) include a selection FET for selectively coupling the corresponding resistive (or capacitive) path between the sources of the input FETs. In the case where one of the input FETs is biased with a reference gate voltage, the source of each selection FET is coupled to the source of such input FET.

25 Claims, 7 Drawing Sheets

(51) Int. Cl.
*H04L 25/02* (2006.01)
*H04L 25/03* (2006.01)
*H03F 3/45* (2006.01)

(52) U.S. Cl.
CPC .... *H04L 25/0292* (2013.01); *H04L 25/03878* (2013.01); *H03F 2203/45488* (2013.01); *H03F 2203/45494* (2013.01); *H03F 2203/45504* (2013.01)

(56) References Cited

U.S. PATENT DOCUMENTS

| | | | |
|---|---|---|---|
| 7,358,811 B2* | 4/2008 | Koh | H03F 3/45183 |
| | | | 330/254 |
| 7,391,829 B2 | 6/2008 | Tripathi et al. | |
| 7,598,811 B2* | 10/2009 | Cao | H03F 3/45183 |
| | | | 330/254 |
| 7,656,225 B2 | 2/2010 | Isobe et al. | |
| 7,902,859 B2 | 3/2011 | Ricard et al. | |
| 7,916,780 B2* | 3/2011 | Lee | H04L 25/03885 |
| | | | 375/232 |
| 7,961,007 B2* | 6/2011 | Scott | H03K 19/01851 |
| | | | 326/82 |
| 8,705,606 B2 | 4/2014 | Farjad-Rad | |
| 9,054,645 B1* | 6/2015 | Wang | H03F 1/0261 |
| 2003/0142738 A1 | 7/2003 | Ho et al. | |
| 2004/0246026 A1 | 12/2004 | Wang et al. | |
| 2008/0247452 A1 | 10/2008 | Lee | |
| 2013/0322506 A1 | 12/2013 | Zerbe et al. | |

\* cited by examiner

PROGRAMMABLE HIGH-SPEED EQUALIZER AND RELATED METHOD

CROSS REFERENCE TO RELATED APPLICATION

This application claims priority to Provisional Application, Ser. No. 62/140,364, filed on Mar. 30, 2015, which is incorporated herein by reference.

BACKGROUND

Field

Aspects of the present disclosure relate generally to signal equalization and filtering, and more particularly, to a low power programmable equalizer or filter and related method.

Background

A data transmitter (e.g., a dynamic random access memory (DRAM)) typically transmits data to a data receiver (e.g., a system on chip (SoC)) by way of a communication medium, such as printed circuit board (PCB) metallization traces or communications cables. Such communication medium typically has a transfer function that is similar to a low pass filter, i.e., at or above a certain frequency (e.g., the cutoff frequency), the attenuation of the data signal increases with frequency. The rate at which data may be sent from the transmitter to the receiver depends on the cutoff frequency, i.e., higher cutoff frequencies—higher data rates, lower cutoff frequencies—lower data rates.

One technique to compensate for the inherent low frequency response of a communication medium is to use an equalization device or equalizer at the receiver. The equalizer has a frequency response that provides gain to higher frequencies of a received signal in order to compensate for the inherent attenuation of the higher frequencies associated with the signal transmission via a typical communication medium. Accordingly, by employing an equalizer at a receiver, higher data rates between the data transmitter and receiver may be achieved.

SUMMARY

The following presents a simplified summary of one or more embodiments in order to provide a basic understanding of such embodiments. This summary is not an extensive overview of all contemplated embodiments, and is intended to neither identify key or critical elements of all embodiments nor delineate the scope of any or all embodiments. Its sole purpose is to present some concepts of one or more embodiments in a simplified form as a prelude to the more detailed description that is presented later.

An aspect of the disclosure provides for an apparatus suitable for equalization or filtering applications. In particular, the apparatus comprises a first FET including a first gate, a first drain, and a first source, wherein the first gate is configured to receive an input signal; a second FET including a second gate, a second drain, and a second source; and a plurality of selectable resistive paths, wherein each selectable resistive path comprises a first resistor coupled in series with a selection device, wherein the selection device is configured to couple the corresponding selectable resistive path between first and second nodes based on a select signal, and wherein the first resistor includes a first end coupled to the first node.

Another aspect of the disclosure provides a method of generating an output signal based on an input signal. The method comprises generating a current; steering at least a portion of the current through an equalization circuit coupled between first and second nodes, wherein the at least portion of the current is steered through the equalization circuit from the first node to the second node in response to a first logic voltage of the input signal, wherein the at least portion of the current is steered through the equalization circuit from the second node to the first node in response to a second logic voltage of the input signal, wherein the equalization circuit comprises a plurality of selectable resistive paths, wherein each selectable resistive path comprises a resistor coupled in series with a selection device, wherein the selection device is configured to couple the corresponding selectable resistive path between the first and second nodes based on a select signal, and wherein the first resistor includes a first end coupled to the first node; and providing the at least portion of the current through a resistive device to generate the output signal.

Another aspect of the disclosure relates to an apparatus for generating an output signal based on an input signal. The apparatus comprises means for generating a current; means for steering at least a portion of the current through an equalization circuit coupled between first and second nodes, wherein the at least portion of the current is steered through the equalization circuit from the first node to the second node in response to a first logic voltage of the input signal, wherein the at least portion of the current is steered through the equalization circuit from the second node to the first node in response to a second logic voltage of the input signal, wherein the equalization circuit comprises a plurality of selectable resistive paths, wherein each selectable resistive path comprises a resistor coupled in series with a selection device, wherein the selection device is configured to couple the corresponding selectable resistive path between the first and second nodes based on a select signal, and wherein the first resistor includes a first end coupled to the first node; and means for providing the at least portion of the current through a resistive device to generate the output signal.

To the accomplishment of the foregoing and related ends, the one or more embodiments comprise the features hereinafter fully described and particularly pointed out in the claims. The following description and the annexed drawings set forth in detail certain illustrative aspects of the one or more embodiments. These aspects are indicative, however, of but a few of the various ways in which the principles of various embodiments may be employed and the description embodiments are intended to include all such aspects and their equivalents.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Figure 1A:
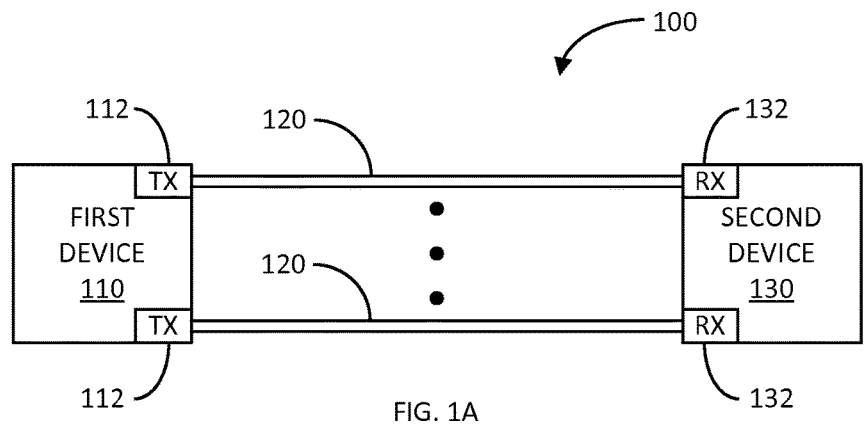
FIG. 1A illustrates a block diagram of an exemplary communication system in accordance with an aspect of the disclosure.

FIG. 1A illustrates a block diagram of an exemplary communication system 100 in accordance with an aspect of the disclosure. The communication system 100 comprises a first device 110 coupled to a second device 130 by way of one or more transmission lines 120. The one or more transmission lines 120 may comprise one or more metallization traces, one or more communications cables, or other types of transmission lines. Additionally, the one or more transmission lines 120 may be configured for transmitting one or more single-ended signals or one or more differential signals, respectively.

In this example, the first device 110 is configured to send data to the second device 130 by way of the one or more transmission lines 120. For example, if the communication system 100 is configured as a memory subsystem, the first device 110 may comprise a memory circuit, such as a dynamic random access memory (DRAM), and the second device 130 may comprise a processor-based device, such as a system on chip (SOC). Although, in this example, the first device 110 is sending data to the second device 130, it shall be understood that the second device 130 may send data to the first device, or both devices 110 and 130 may transmit data to each other in a bidirectional manner.

In this example, the first device 110 comprises one or more transmitter circuits (TX) 112, such as input/output (I/O) drivers, for transmitting one or more data signals to the second device 130 by way of the one or more transmission lines 120, respectively. In this regard, the second device 130 comprises one or more receiving circuits (RX) 132 for receiving the one or more data signals from the first device 110 by way of the one or more transmission lines 120, respectively.

Figure 1B:
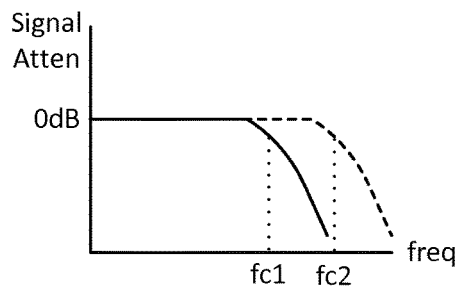
FIG. 1B illustrates a graph of an exemplary frequency response of a transmission line in accordance with another aspect of the disclosure.

FIG. 1B illustrates a graph of an exemplary frequency response of each of the one or more exemplary transmission lines 120 in accordance with another aspect of the disclosure. The x- or horizontal axis of the graph represents frequency, and the y- or vertical axis of the graph represents signal attenuation. The solid line depicts the inherent frequency response of the transmission line 120.

Each of the transmission lines 120 are generally modeled as a series resistance and parasitic inductor coupled to a shunt parasitic capacitance. As such, the frequency response of each transmission line 120 is similar to a low-pass filter. That is, the transmission line 120 exhibits relatively little signal attenuation for low frequencies or frequencies below a cutoff frequency fc1 (e.g., at 3 dB attenuation or half power). Above the cutoff frequency fc1, the attenuation increases monotonically with frequency.

The maximum data rate of the data signal transmitted by way of the transmission line 120 is generally proportional or related to the cutoff frequency fc1 associated with the transmission line. That is, a higher cutoff frequency fc1 associated with the transmission line 120 translates to higher achievable data rates for the transmission line 120; and conversely, a lower the cutoff frequency fc1 associated with the transmission line 120 translates to lower achievable data rates for the transmission line 120. The reason being is that the inherent low frequency response of the transmission line 120 corrupts the higher frequency components of the data signal (e.g., frequency components above the cutoff frequency fc1).

Figure 1D:
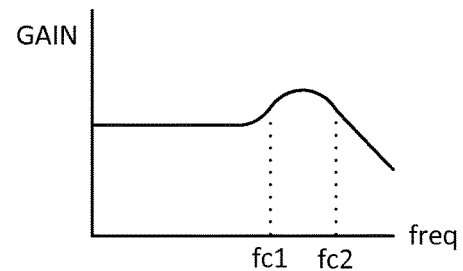
FIG. 1D illustrates a graph of a frequency response of an exemplary equalizer in accordance with another aspect of the disclosure.
Figure 1C:
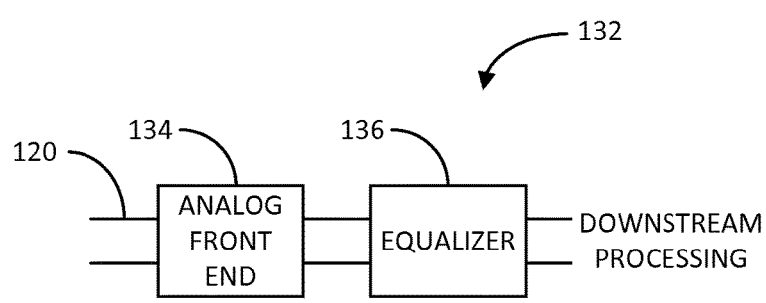
FIG. 1C illustrates a block diagram of an exemplary receiver in accordance with another aspect of the disclosure.

FIG. 1C illustrates a block diagram of the exemplary receiver circuit 132 employed in the second device 130 in accordance with another aspect of the disclosure. The receiver circuit 132 may comprise an analog front end 134, an equalizer 136, and other circuits for performing downstream signal processing (not shown). The analog front end 134 receives the data signal and configures the analog signal for digital processing. The equalizer 136 is configured to provide a defined frequency response to compensate for the inherent low-pass frequency response of the transmission line 120.

FIG. 1D illustrates a graph of a frequency response of the exemplary equalizer 136 in accordance with another aspect of the disclosure. The x- or horizontal axis of the graph represents frequency, and the y- or vertical axis of the graph represents signal gain. As shown, the frequency response of the equalizer 136 is configured to provide gain to the received data signal in a frequency range around the cutoff frequency fc1 of the transmission line 120 to a higher frequency fc2. Thus, as can be seen in FIG. 1B, the combined transfer function of the transmission line 120 and the equalizer 136 produce a compensated frequency response, represented by a dashed line, that effectively extends the cutoff frequency to fc2. This allows for higher data rates via the transmission line 120.

Figure 2:
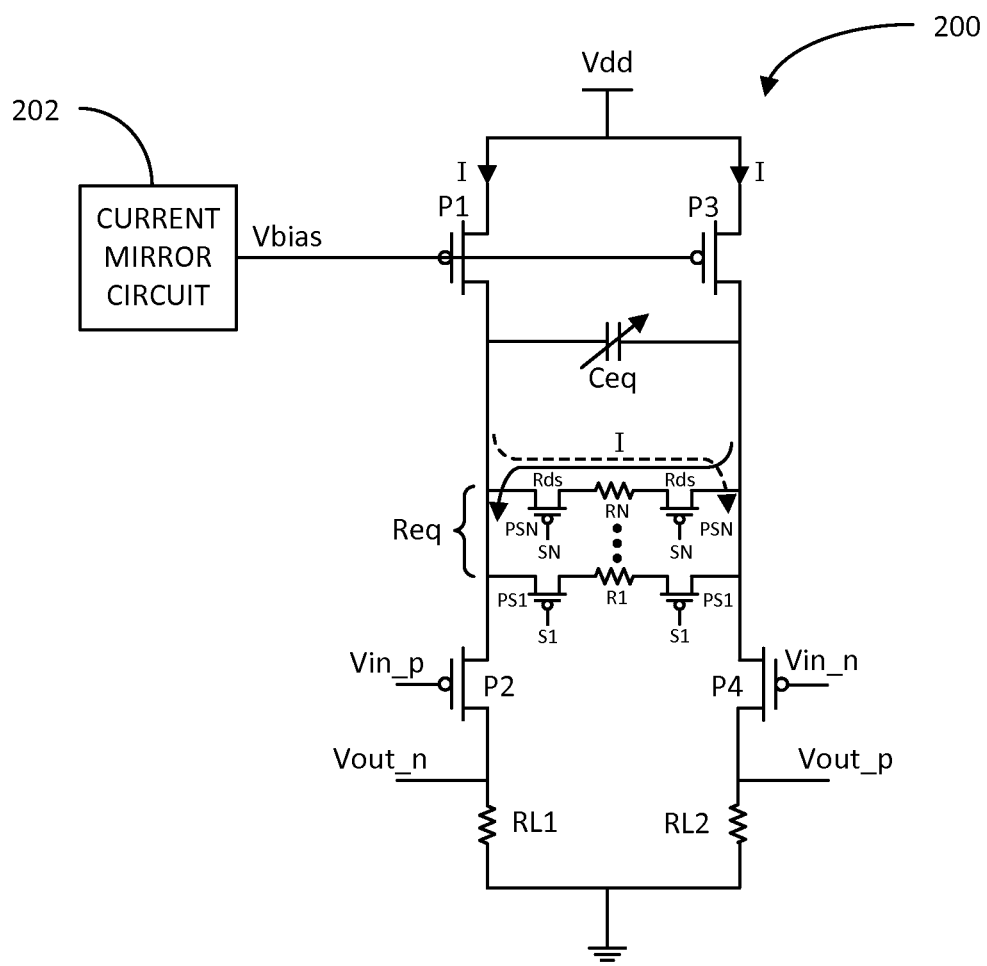
FIG. 2 illustrates a circuit diagram of an exemplary programmable equalizer in accordance with another aspect of the disclosure.

FIG. 2 illustrates a circuit diagram of an exemplary programmable equalizer 200 in accordance with another aspect of the disclosure. The equalizer 200 may be an exemplary implementation of the equalizer 136 previously discussed. In particular, the equalizer 200 is configured to receive an input differential signal (Vin_p, Vin_n) and generate an output differential signal (Vout_p, Vout_n), where the output signal includes higher frequencies enhanced by the frequency response of the equalizer 200.

In particular, the equalizer 200 comprises a first p-channel metal oxide semiconductor field effect transistor (FET) (hereinafter "PMOS device") P1, a second PMOS device P2, and a first load resistor RL1 coupled in series between a first voltage rail Vdd and a second voltage rail (e.g., ground). The equalizer 200 further comprises a third PMOS device P3, a fourth PMOS device P4, and a second load resistor RL2 coupled in series between the first voltage rail Vdd and the second voltage rail or ground.

The positive component Vin_p and negative component Vin_n of the input differential signal are applied to the gates of PMOS devices P2 and P4, respectively. The positive and negative components of the output signal Vout_p and Vout_n are produced at the drains of PMOS devices P4 and P2, respectively. A current mirror circuit 202 generates a bias voltage Vbias for biasing the gates of PMOS devices P1 and P3 to set the current I through these devices.

The equalization components or circuit of the equalizer 200 includes a variable capacitor Ceq and a variable resistor Req connected in parallel between the respective sources of PMOS devices P2 and P4. The variable capacitor Ceq may be implemented with a varactor or with two or more selectable capacitive paths. Similarly, the variable resistor Req may be implemented with N selectable resistive paths (N≥2), each including a resistor (e.g., R1 to RN) interposed between a pair of selection PMOS devices (PS1 pair to PSN pair). Selection signals S1 to SN are applied to the gates of the selection PMOS device pairs PS1 to PSN, respectively. To avoid distortion of the output signal, the equalizer 200 including the selectable resistive paths is made symmetrical, i.e., that is why there is a resistor interposed between two selection PMOS devices for each selectable resistive path.

In operation, when the positive and negative components Vin_p and Vin_n of the input signal are logically high and low respectively, the PMOS devices P2 and P4 are turned off and on, respectively. This causes the current I (as indicated by the dashed curvy line) to flow from PMOS device P1, through the selected or variable equalization components Req and Ceq, through PMOS device P4 and load resistor RL2, to ground. Similarly, when the positive and negative components Vin_p and Vin_n of the input signal are logically low and high, the PMOS devices P2 and P4 are turned on and off, respectively. This causes the current I (as indicated by the solid curvy line) to flow from PMOS device P3, through the selected or variable equalization components Req and Ceq, through PMOS device P2 and load resistor RL1, to ground.

Thus, because the current I flows through the effective resistor Req and effective capacitor Ceq connected in parallel between the respective sources of PMOS devices P2 and P4, the equalization components operate as a series-connected parallel RC circuit. That is, at lower frequency, the impedance of the series-connected parallel RC circuit is higher resulting in higher signal loss through RC circuit. Thus, the gain of the programmable equalizer 200 at lower frequency is lower. Conversely, at higher frequency, the impedance of the series-connected parallel RC circuit is lower resulting in less signal loss through RC circuit. Thus, the gain of the programmable equalizer 200 at higher frequency is higher.

The particular selection or adjustment of the effective resistance Req and effective capacitance Ceq affects the frequency response of the programmable equalizer 200. For instance, with reference to the exemplary frequency response shown in FIG. 1D, the selection or adjustment of Req and Ceq may result in a frequency shift (upwards or downwards) in the gain region around fc1 and fc2, as well as the amount of gain (higher or lower) in the gain region. Thus, through proper selecting and/or varying of Req and Ceq, an overall frequency response that compensates for the frequency response of the transmission line 120 as shown in FIG. 1B (dashed line) may be achieved.

There are several disadvantages to the equalizer 200. First, the two selection PMOS devices (PS1 to PSN) in each selectable resistive path produce voltage drops across them (I*2Rds, where Rds is the drain-to-source resistance of each device). As a consequence, the voltage at the source of the turned on input PMOS device P2 or P4 is significantly lower than Vdd. This reduces the gate-to-source voltage Vgs of the turned on PMOS device P2 or P4, which could adversely affect the turning on of the device and the voltage of the output signal. To address this for the worst case scenario, the supply voltage Vdd may be raised. However, this results in more power consumption. Thus, it is said, that because of these voltage drops, there is less output voltage head room.

Second, the gate-to-source voltages (Vgs) of the selection PMOS devices (PS1 to PSN) vary during switching operation of the equalizer 200. This is because the voltages at the sources of these selection devices, being coupled to the sources of PMOS devices P2 and P4, vary between high and low depending on the state of the input signal Vin_p and Vin_n. The varying Vgs produces drain-to-source resistance (Rds) variation of the selection PMOS devices. Because there are two selection PMOS devices in each selectable resistive path, one of the devices will have a different Vgs, and hence, a different Rds than the other device. As such, the equalizer 200 is no longer symmetrical, which produces distortion of the output signal.

Third, because of the symmetry requirement, each selectable resistive path requires two selection PMOS devices (PS1-pair to PSN-pair), which consumes valuable integrated circuit (IC) die area. Fourth, each the selection PMOS devices (PS1 to PSN) add gate-to-source parasitic capacitance, which reduces the high frequency performance of the equalizer 200.

Figure 3:
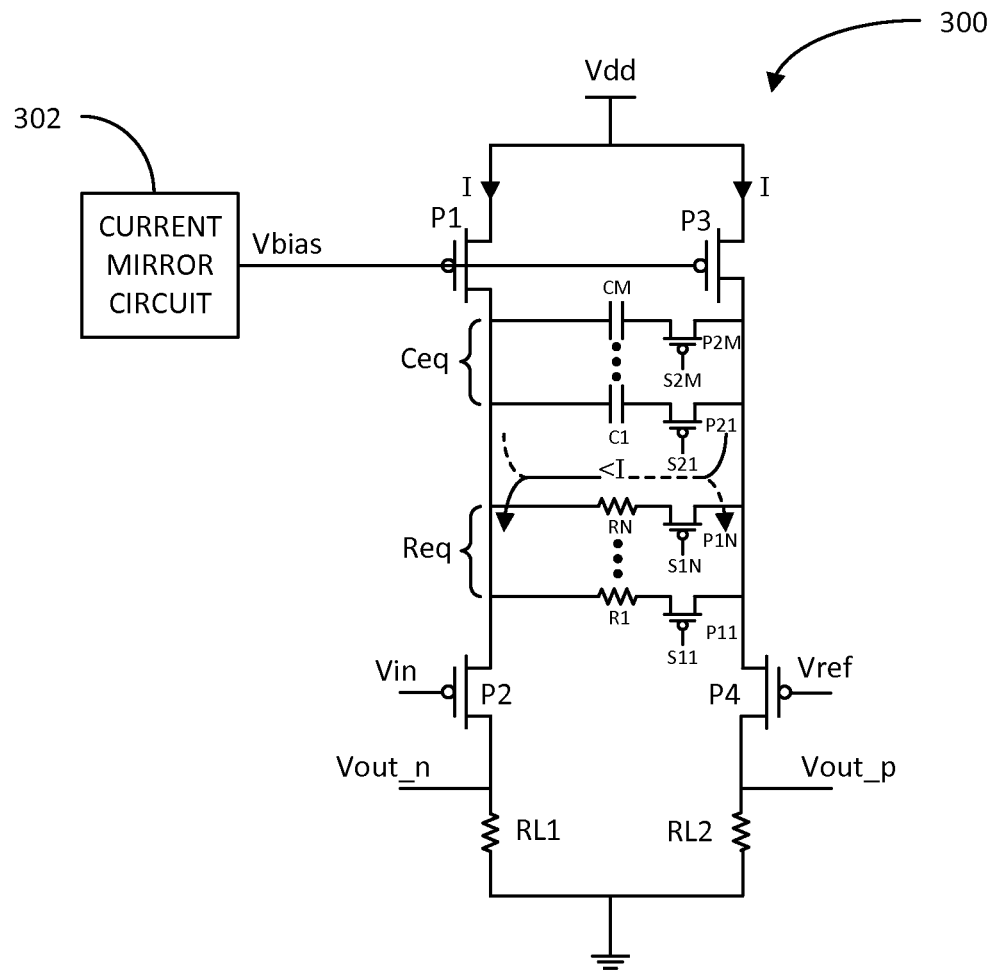
FIG. 3 illustrates a circuit diagram of another exemplary programmable equalizer in accordance with another aspect of the disclosure.

FIG. 3 illustrates a circuit diagram of an exemplary programmable equalizer 300 in accordance with another aspect of the disclosure. First, the equalizer 300 is made single-ended, instead of being double-ended or differential. This is done to eliminate the requirement that the equalizer 200 needs to be symmetrical. To make the equalizer 300 single-ended, a constant reference voltage Vref (e.g., Vdd/2 or some other appropriate value between Vdd and ground) is applied to the gate of PMOS device P4, and a single-ended input signal Vin is applied to the gate of PMOS device P2. Since the equalizer 300 need not be symmetrical, each of the selectable resistive paths includes a single selection PMOS device (P11 to P1N). Additionally, within each selectable resistive path, the selection PMOS device (P11 to P1N) is configured such that the source of the selection PMOS device is coupled to the source of the (reference-voltage) PMOS device P4, the drain of the selection PMOS device is coupled to the resistor (R1 to RN), and the gate is configured to receive a path selection signal (S11 to S1N).

The advantages of the equalizer 300 are as follows: (1) The elimination of the symmetry requirement allows each selectable resistive path to be configured with a single selection PMOS device—leading to less IR loses via each selection path (I*Rds versus 2I*Rds), and hence, more output voltage head room, as previously discussed; (2) The selection PMOS device is connected to the Vref side of the path to maintain Vgs of the selection PMOS device substantially constant during switching operation of the equalizer (the source of PMOS device P4 is substantially constant due to the substantially constant reference voltage Vref)—this reduces distortion of the output signal; (3) Less IC die area is needed to implement a single selection PMOS device versus two in each path—or alternatively, the single selection PMOS device may be made twice as large to reduce its resistance Rds, and reduce the IR losses through each path for more output voltage head room; and (4) Less gate-to-source parasitic capacitance because of one selection PMOS device instead of two in each path, thereby resulting in improved high frequency performance for the equalizer 300.

As shown, the variable capacitor Ceq of the equalizer 300 may be implemented as M selectable capacitive paths (M≥2), each path including a capacitor (C1 to CM) and a single selection PMOS device (P21 to P2M). The capacitors C1 to CM may be implemented as on-chip capacitors, such as metal oxide semiconductor capacitors (MOS CAP), metal insulator metal (MIM) capacitors, and metal oxide metal (MOM) capacitors. It shall be understood that a variable capacitor, such as a varactor, may be substituted for one or all of the selectable capacitive paths.

Similar to the selectable resistive paths, the selection PMOS device (P21 to P2M) of each selectable capacitive path is situated such that the source of the selection PMOS device is coupled to the source of the (reference-voltage) PMOS device P4, the drain of the selection PMOS device is coupled to the capacitor (C1 to CM), and the gate is configured to receive a path selection signal (S21 to S2M). The advantages that apply to the resistive paths by having a single selection PMOS device and its source coupled to the source of the reference-voltage PMOS device P4 apply as well to the capacitive paths. That is, since there is a single selection PMOS device in each capacitive path, there is less IR loses and less parasitic capacitances as compared to a capacitive path that includes two selection PMOS devices. Further, since the source of the selection PMOS device in each capacitive path is coupled to the source of reference-voltage PMOS device P4, the Vgs, and hence, the Rds is substantially constant so that there is less distortion of the output signal.

The operation of equalizer 300 is similar to that of equalizer 200. Thus, when the single-ended input voltage Vin is logically high (higher than the reference voltage), PMOS device P4 is turned on more than PMOS device P2. As a result, current (e.g., <I) flows through the selected equalization circuit Req and Ceq from the drain of PMOS device P1 to the source of PMOS device P4. Conversely, when the single-ended input voltage Vin is logically low (lower than the reference voltage), PMOS device P2 is turned on more than PMOS device P4. As a result, current (e.g., <I) flows through the selected equalization circuit Req and Ceq from the drain of PMOS device P3 to the source of PMOS device P2. Based on the effective Req and Ceq of the equalization circuit, the equalizer 300 exhibits a particular frequency gain response, as previously discussed.

Figure 4:
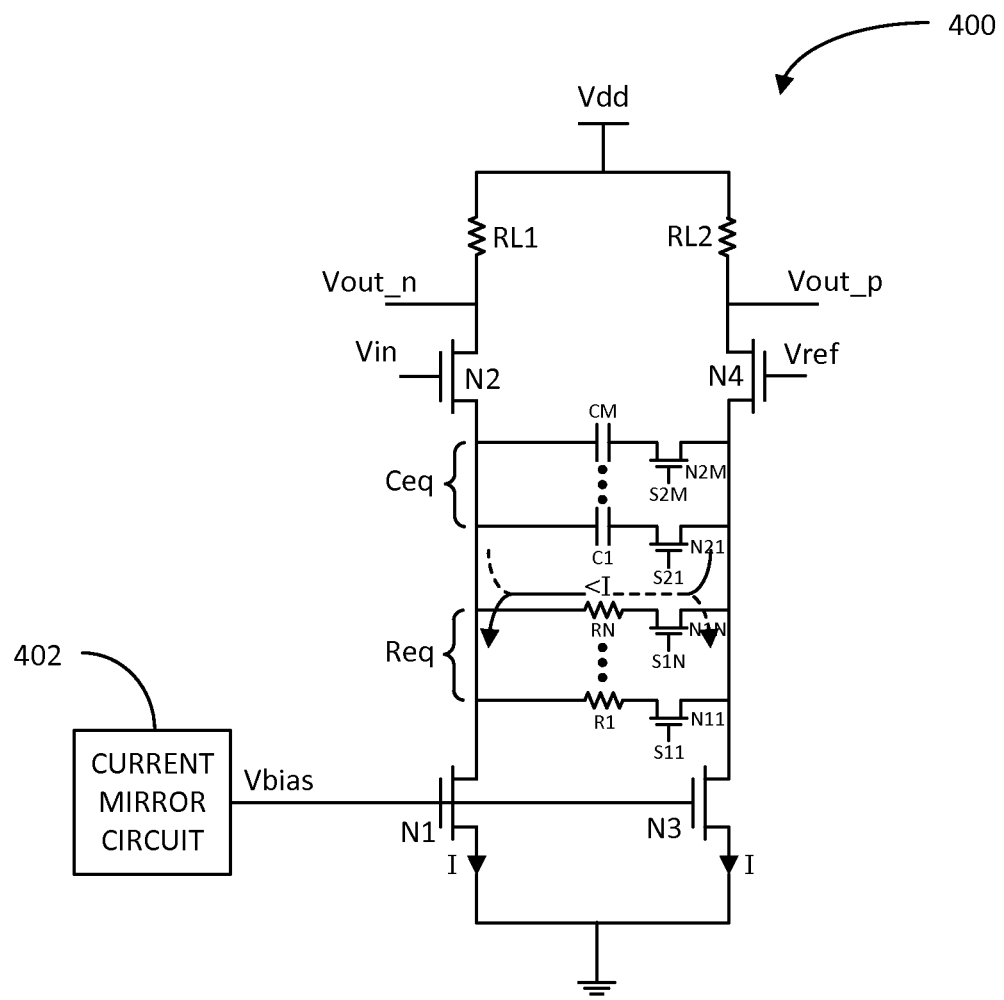
FIG. 4 illustrates a circuit diagram of yet another exemplary programmable equalizer in accordance with another aspect of the disclosure.

FIG. 4 illustrates a circuit diagram of another exemplary programmable equalizer 400 in accordance with another aspect of the disclosure. In particular, the equalizer 400 is an NMOS version of the PMOS equalizer 300 previously discussed. That is, the FETs in the equalizer 400 are n-channel metal oxide semiconductor (NMOS) FETs (hereinafter "NMOS devices"). Additionally, because of the NMOS implementation, the arrangement of the devices of the equalizer 400 is flipped relative to the devices of the PMOS equalizer 300.

More specifically, the programmable equalizer 400 comprises a first load resistor RL1, an NMOS device N2, and an NMOS device N1 coupled between a first voltage rail (e.g., Vdd) and a second voltage rail (e.g., ground). The equalizer 400 further comprises a second load resistor RL2, an NMOS device N4, and an NMOS device N3 coupled in series between Vdd and ground. The equalizer 400 further comprises a current mirror circuit 402 for generating a bias voltage Vbias for the gates of NMOS devices N1 and N3 to set the current through devices N1 and N3. The gate of NMOS device N2 is configured to receive a single-ended input signal Vin, and the gate of NMOS device N4 is configured to receive a reference voltage Vref (e.g., Vdd/2 or some other suitable value between Vdd and ground). The positive and negative components Vout_p and Vout-N of the output signal are generated at the drains of NMOS devices N4 and N2, respectively.

The programmable equalizer 400 further comprises an equalization circuit including N selectable resistive paths (N≥2) and M selectable capacitive paths (M≥2) coupled in parallel between the sources of NMOS devices N2 and N4. Each of the resistive paths comprises a resistor (R1 to RN) in series with a selection NMOS device (N11 to N1N). Each selection NMOS device (N11 to N1N) comprises a source coupled to the source of the reference voltage NMOS device N4, a drain coupled to the corresponding resistor (R1 to RN), and a gate configured to receive a corresponding selection signal (S11 to S1N). Based on the states of the selection signals S11 to S1N, the selected parallel resistive paths provide an equivalent resistance Req between the sources of NMOS devices N2 and N4.

Similarly, each of the capacitive paths comprises a capacitor (C1 to CM) in series with a selection NMOS device (N21 to N2M). Each selection NMOS device (N21 to N2M) comprises a source coupled to the source of the reference voltage NMOS device N4, a drain coupled to the corresponding capacitor (C1 to CN), and a gate configured to receive a corresponding selection signal (S21 to S2M). Based on the states of the selection signals S21 to S2M, the selected parallel capacitive paths provide an equivalent capacitance Ceq between the sources of NMOS devices N2 and N4. It shall be understood that a variable capacitor, such as a varactor, may be substituted for one or all of the selectable capacitive paths.

In operation, the NMOS devices N1 and N3, being controlled by the current mirror circuits 402, set the current through the equalization components Req and Ceq. The input NMOS N2 operates as a current steering device based on the input signal Vin. For instance, if the input voltage Vin is logically high, NMOS device N2 is turned on more than NMOS device N4. As a result, current (e.g., <I) flows through the equalization components Req and Ceq from the source of NMOS device N2 to the drain of NMOS device N3. Conversely, if the input voltage Vin is logically low, NMOS device N4 is turned on more than NMOS device N2. As a result, current (e.g., <I) flows through the equalization components Req and Ceq from the source of NMOS device N4 to the drain of NMOS device N1. The RC circuit of the selected equalization components Req and Ceq provide the desired frequency gain response for the programmable equalizer 400.

Figure 5:
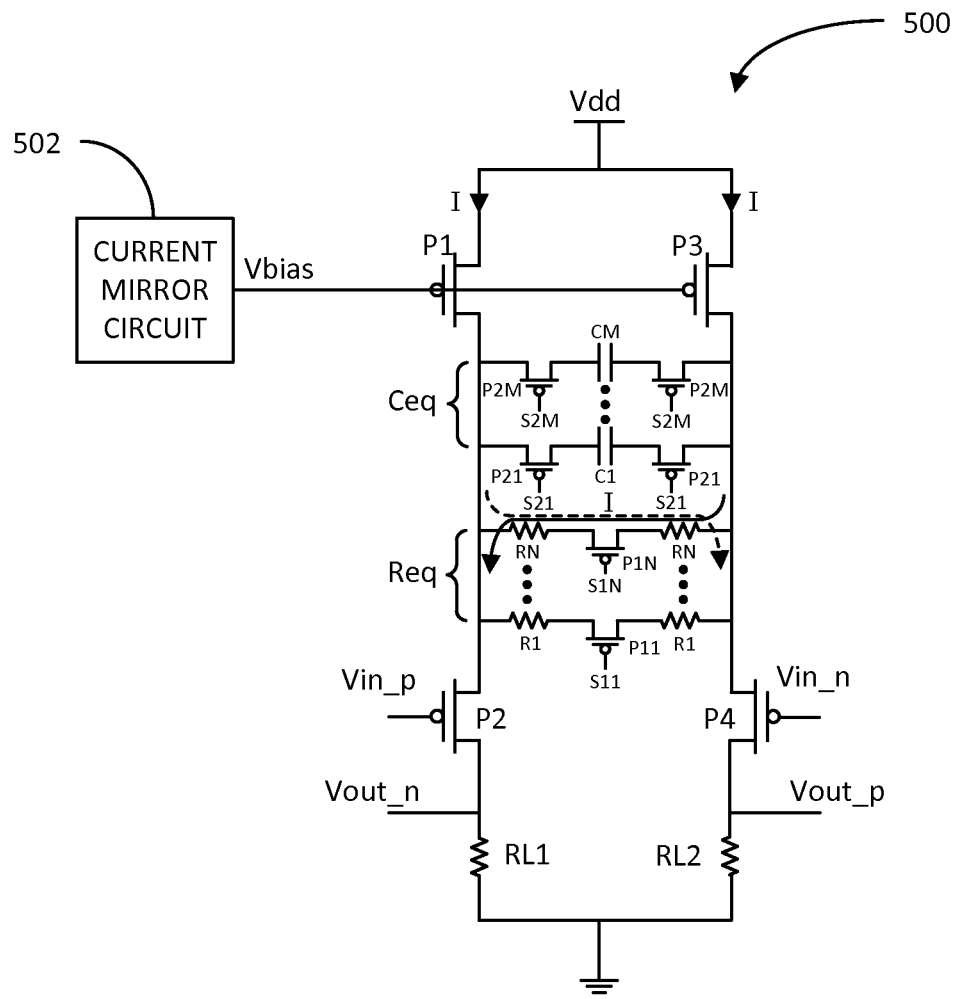
FIG. 5 illustrates a circuit diagram of still another exemplary programmable equalizer in accordance with another aspect of the disclosure.

FIG. 5 illustrates a circuit diagram of another exemplary programmable equalizer 500 in accordance with another aspect of the disclosure. In particular, the equalizer 500 is a differential signal version of the single-ended PMOS equalizer 300 previously discussed. That is, instead of the single-ended input signal Vin and reference voltage Vref being applied to the respective gates of PMOS devices P2 and P4 as in equalizer 300, the positive and negative components of the input differential signal Vin_p and Vin_n are applied to the respective gates of PMOS devices P2 and P4 in equalizer 500.

Further, due to the symmetry requirement of a differential signal equalizer, each selectable resistive path comprises a single selection PMOS device (P11 to P1N) situated between a pair of resistors (R1-pair to RN-pair). Similarly, each selectable capacitive path comprises a capacitor (corresponding C1 to CM) situated between a pair of selection PMOS devices (P21 to P2M). It shall be understood that a variable capacitor, such as a varactor, may be substituted for one or all of the selectable capacitive paths.

In operation, when the positive and negative components Vin_p and Vin_n of the input voltage are high and low logic voltages, respectively, PMOS devices P4 and P2 are turned on and off, respectively. As a result, current (e.g., substantially I) flows through the selected equalization circuit Req and Ceq from the drain of PMOS device P1 to the source of PMOS device P4. Conversely, when the positive and negative components Vin_p and Vin_n of the input voltage are low and high logic voltages, respectively, PMOS devices P2 and P4 are turned on and off, respectively. As a result, current (e.g., substantially I) flows through the selected equalization circuit Req and Ceq from the drain of PMOS device P3 to the source of PMOS device P2. Based on the effective Req and Ceq of the equalization circuit, the equalizer 500 exhibits a particular frequency gain response, as previously discussed.

Figure 6:
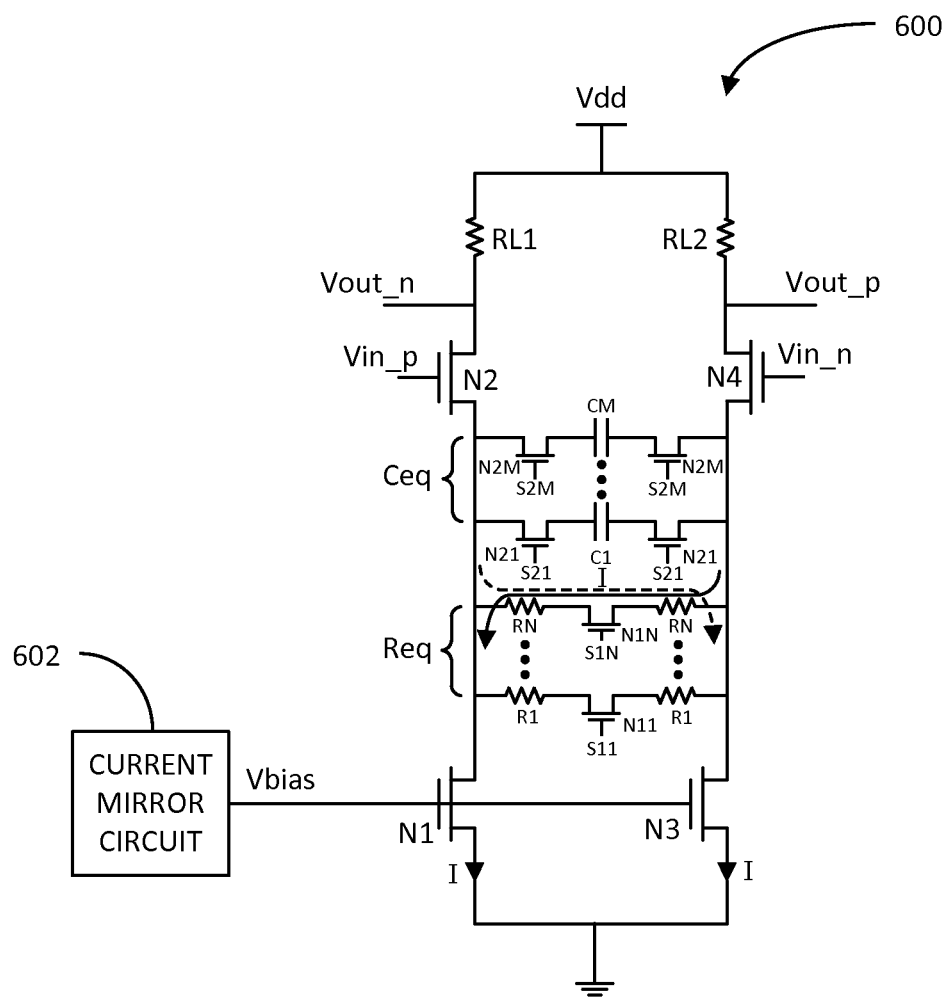
FIG. 6 illustrates a circuit diagram of an additional exemplary programmable equalizer in accordance with another aspect of the disclosure.

FIG. 6 illustrates a circuit diagram of still another exemplary programmable equalizer 600 in accordance with another aspect of the disclosure. In particular, the equalizer 600 is an NMOS version of the PMOS equalizer 500 previously discussed. That is, the FETs in the equalizer 600 are instead NMOS devices. Additionally, because of the NMOS implementation, the arrangement of the devices of the NMOS equalizer 600 is flipped relative to the devices of the PMOS equalizer 500.

In operation, when the positive and negative components Vin_p and Vin_n of the input voltage are high and low logic voltages, respectively, NMOS devices N2 and N4 are turned on and off, respectively. As a result, current (e.g., substantially I) flows through the selected equalization circuit Req and Ceq from the source of NMOS device N2 to the drain of NMOS device N3. Conversely, when the positive and negative components Vin_p and Vin_n of the input voltage are low and high logic voltages, respectively, NMOS devices N4 and N2 are turned on and off, respectively. As a result, current (e.g., substantially I) flows through the selected equalization circuit Req and Ceq from the source of NMOS device N4 to the drain of NMOS device N1. Based on the effective Req and Ceq of the equalization circuit, the equalizer 600 exhibits a particular frequency gain response, as previously discussed.

Figure 7:
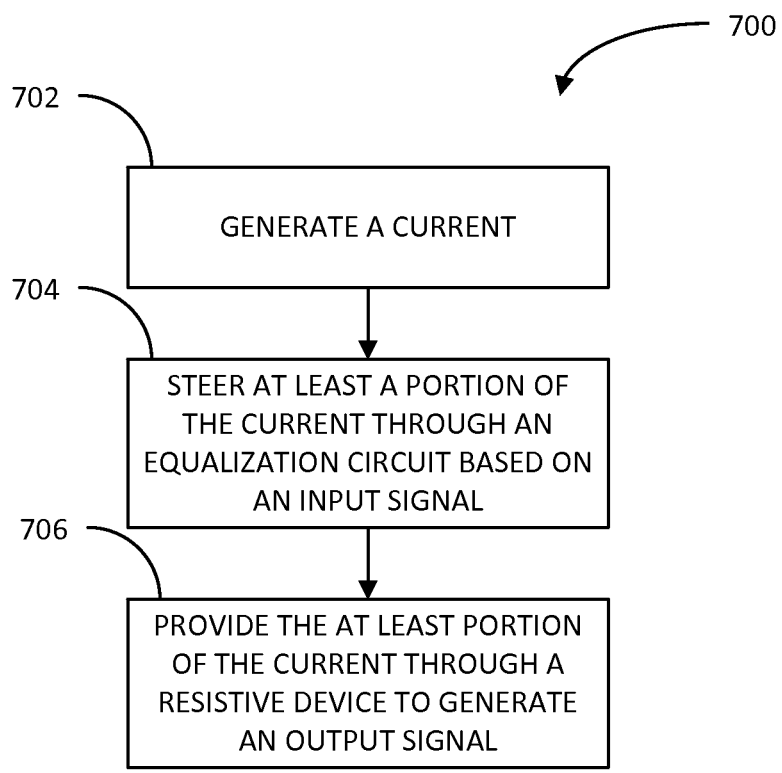
FIG. 7 illustrates a flow diagram of an exemplary method of equalizing an input signal in accordance with another aspect of the disclosure.

FIG. 7 illustrates a flow diagram of an exemplary method 700 of equalizing an input signal in accordance with another aspect of the disclosure. According to the method 700, a current is generated (block 702). For example, with reference to equalizers 300 and 500, PMOS devices P1 and P3 are examples of means for generating a current. With reference to equalizers 400 and 600, NMOS devices N1 and N3 are examples of means for generating a current.

Further, according to the method 700, at least a portion of the current is steered through an equalization circuit based on an input signal (block 704). For example, with reference to equalizers 300 and 500, PMOS devices P2 and P2/P4 are examples of means for steering at least a portion of the current through the equalization circuit Req-Ceq based on a single-ended input signal Vin or a differential input signal Vin_p and Vin_n, respectively. With reference to equalizers 400 and 600, NMOS devices N2 and N2/N4 are examples of means for steering at least a portion of the current through the equalization circuit Req-Ceq based on a single-ended input signal Vin or a differential input signal Vin_p and Vin_n, respectively.

Additionally, according to the method 700, the at least portion of the current is provided through a resistive device to generate the output signal (block 706). For example, with reference to equalizers 300 and 500, the coupling of the resistive devices RL1 and RL2 with PMOS devices P2 and P4 is an example of a means for providing the at least portion of the current through a resistive device. With reference to equalizers 400 and 600, the coupling of the resistive devices RL1 and RL2 with NMOS devices N2 and N4 is an example of a means for providing the at least portion of the current through a resistive device.

Although in the discussion of the exemplary programmable equalizers described herein, the equalizers have been described to apply a programmable frequency gain response to an input signal to compensate for an inherent frequency response of a transmission line by which the input signal was received, it shall be understood that the equalizers or, more generally, apparatuses may be used in other applications, such as filtering applications. The equalization component or circuit of the programmable equalizers described herein may be configured to additionally include a variable inductor or a plurality of selectable inductive paths, or other combinations of variable/selectable resistors, capacitors, and inductors, depending on the desired application.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. An apparatus, comprising:
a first field effect transistor (FET) including a first gate, a first drain, and a first source, wherein the first gate is configured to receive an input signal;
a second FET including a second gate, a second drain, and a second source, wherein the second gate is configured to receive a constant reference voltage during a same time interval as the first gate is configured to receive the input signal; and
a plurality of selectable resistive paths, wherein each selectable resistive path consists of an asymmetrical arrangement of components between the first and second sources, wherein the asymmetrical arrangement of components comprises a resistor coupled in series with a selection FET, wherein the selection FET is configured to couple the corresponding selectable resistive path between the first and second sources based on a select signal, and wherein the selection FET includes a source directly coupled to the second source.

2. The apparatus of claim 1, further comprising:
a third field effect transistor (FET) including a third gate, a third drain, and a third source;
a first load resistor coupled in series with the first and third FETs between first and second voltage rails;
a fourth FET including a fourth gate, a fourth drain, and a fourth source, wherein the fourth gate of the fourth FET and the third gate of the third FET are coupled together and configured to receive a bias voltage for setting a drain-source current through the third and fourth FETs;
a second load resistor coupled in series with the second and fourth FETs between the first and second voltage rails, wherein an output signal is produced at third and fourth nodes situated between the first FET and the first load resistor and the second FET and the second load resistor, respectively.

3. The apparatus of claim 1, wherein the first and second FETs comprise first and second PMOS devices, respectively.

4. The apparatus of claim 3, wherein the selection FET comprises a selection PMOS FET including a drain coupled to the resistor of the corresponding selectable resistive path, and a gate configured to receive the select signal.

5. The apparatus of claim 1, wherein the first and second FETs comprise first and second NMOS devices, respectively.

6. The apparatus of claim 5, wherein the selection FET comprises a selection NMOS FET including a drain coupled to the resistor of the corresponding selectable resistive path, and a gate configured to receive the select signal.

7. The apparatus of claim 1, further comprising a variable capacitive element coupled between the first and second sources.

8. The apparatus of claim 1, further comprising a plurality of selectable capacitive paths, wherein each selectable capacitive path comprises a capacitor coupled in series with another selection device, and wherein the another selection device is configured to couple the corresponding selectable capacitive path between the first and second nodes based on another select signal.

9. The apparatus of claim 1, wherein the first and second FETs are respectively coupled between a first rail and a second rail, wherein the first rail is configured to receive a first rail voltage, wherein the second rail is configured to receive a second rail voltage, and wherein the constant reference voltage is substantially halfway between the first and second rail voltages.

10. The apparatus of claim 1, wherein the asymmetrical arrangement of components consists only of the resistor and the selection FET.

11. A method of generating an output signal based on an input signal, comprising:
generating a current;
steering at least a portion of the current through an equalization circuit between first and second sources of first and second field effect transistors (FETs), respectively, wherein the at least portion of the current is steered through the equalization circuit from the first source to the second source in response to a first logic voltage of the input signal, wherein the at least portion of the current is steered through the equalization circuit from the second source to the first source in response to a second logic voltage of the input signal, wherein the equalization circuit comprises a plurality of selectable resistive paths, wherein each selectable resistive path consists of an asymmetrical arrangement of components between the first and second sources, wherein the asymmetrical arrangement of components comprises a resistor coupled in series with a selection FET, wherein the selection FET is configured to couple the corresponding selectable resistive path between the first and second sources based on a select signal, wherein the selection FET includes a source directly coupled to the second source, and wherein steering the at least portion of the current through the equalization circuit from the first source to the second source comprises:
applying the first logic voltage to a first gate of the first FET; and
applying a constant reference voltage to a second gate of the second FET during a same time interval as the first gate is configured to receive the input signal, wherein the constant reference voltage is between the first and second logic voltages; and
providing the at least portion of the current through a resistive device to generate the output signal.

12. The method of claim 11, wherein the first and second FETs comprise first and second PMOS devices, respectively, and wherein steering the at least portion of the current through the equalization circuit from the first source to the second source comprises:
applying the first logic voltage to the first gate of the first PMOS device; and
applying the constant reference voltage to the second gate of the second PMOS device, wherein the first logic voltage is greater than the reference voltage.

13. The method of claim 11, wherein the first and second FETs comprise first and second PMOS devices, respectively, and wherein steering the current through the equalization circuit from the second source to the first source comprises:
applying the second logic voltage to the first gate of the first PMOS device; and
applying the constant reference voltage to the second gate of the second PMOS device, wherein the second logic voltage is less than the reference voltage.

14. The method of claim 13, wherein the selection FET comprises a third PMOS device.

15. The method of claim 11, wherein the first and second FETs comprise first and second NMOS devices, respectively, and wherein steering the current through the equalization circuit from the first source to the second source comprises:
applying the first logic voltage to the first gate of the first NMOS device; and
applying the constant reference voltage to the second gate of the second NMOS device, wherein the first logic voltage is greater than the reference voltage.

16. The method of claim 15, wherein the selection FET comprises a third NMOS device.

17. The method of claim 11, wherein the constant reference voltage is substantially halfway between the first and second logic voltages.

18. The method of claim 11, wherein the asymmetrical arrangement of components consists only of the resistor and the selection FET.

19. An apparatus for generating an output signal based on an input signal, comprising:
means for generating a current;
means for steering at least a portion of the current through an equalization circuit between first and second sources of first and second field effect transistors (FETs), respectively, wherein the at least portion of the current is steered through the equalization circuit from the first source to the second source in response to a first logic voltage of the input signal, wherein the at least portion of the current is steered through the equalization circuit from the second source to the first source in response to a second logic voltage of the input signal, wherein the equalization circuit comprises a plurality of selectable resistive paths, wherein each selectable resistive path consists of an asymmetrical arrangement of components between the first and second sources, wherein the asymmetrical arrangement of components comprises a resistor coupled in series with a selection FET, wherein the selection FET is configured to couple the corresponding selectable resistive path between the first and second sources based on a select signal, wherein the selection FET includes a source directly coupled to the second source, and wherein the means for steering the at least portion of the current through the equalization circuit from the first source to the second source comprises:
  means for applying the first logic voltage to a first gate of the first FET; and
  means for applying a constant reference voltage to a second gate of the second FET during a same time interval as the first gate is configured to receive the input signal, wherein the constant reference voltage is between the first and second logic voltages; and
  means for providing the at least portion of the current through a resistive device to generate the output signal.

20. The apparatus of claim 19, wherein the first and second FETs comprise first and second PMOS devices, respectively, and wherein the means for steering the current comprises:
  means for applying the first logic voltage or the second logic voltage to the first gate of the first PMOS device; and
  means for applying the constant reference voltage to the second gate of the second PMOS device, wherein the first logic voltage is greater than the reference voltage or the second logic voltage is less than the reference voltage.

21. The apparatus of claim 20, wherein the selection FET comprises a third PMOS device.

22. The apparatus of claim 19, wherein the first and second FETs comprise first and second NMOS devices, respectively, and wherein the means for steering the current comprises:
  means for applying the first logic voltage or the second logic voltage to the first gate of the first NMOS device; and
  means for applying the constant reference voltage to the second gate of the second NMOS device, wherein the first logic voltage is greater than the reference voltage or the second logic voltage is less than the reference voltage.

23. The apparatus of claim 22, wherein the selection FET comprises a third NMOS device.

24. The apparatus of claim 19, wherein the constant reference voltage is substantially halfway between the first and second logic voltages.

25. The apparatus of claim 19, wherein the asymmetrical arrangement of components consists only of the resistor and the selection FET.

* * * * *